United States Patent [19]

Arai et al.

[11] Patent Number: 5,720,810
[45] Date of Patent: Feb. 24, 1998

[54] SEMICONDUCTOR SINGLE-CRYSTAL GROWTH SYSTEM

[75] Inventors: Yoshiaki Arai; Keisei Abe; Norihisa Machida, all of Omiya, Japan

[73] Assignees: Mitsubishi Materials Corporation; Mitsubishi Materials Silicon Corporation, both of Tokyo, Japan

[21] Appl. No.: 517,896

[22] Filed: Aug. 22, 1995

[30] Foreign Application Priority Data

Aug. 22, 1994 [JP] Japan .................. 6-196617

[51] Int. Cl.⁶ .................................................. C30B 35/00
[52] U.S. Cl. ............... 117/221; 117/208; 117/213; 117/217; 117/218
[58] Field of Search ............... 65/1; 117/2, 20, 117/200, 208, 210, 213, 214, 217, 218, 30, 220, 221; 164/900; 373/45; 422/245.1; 432/262

[56] References Cited

U.S. PATENT DOCUMENTS

| | | | |
|---|---|---|---|
| 4,352,784 | 10/1982 | Lin | 117/217 |
| 5,009,863 | 4/1991 | Shiua et al. | 117/213 |
| 5,196,173 | 3/1993 | Arai et al. | 117/213 |
| 5,361,721 | 11/1994 | Takano et al. | 117/208 |

FOREIGN PATENT DOCUMENTS

| | | | |
|---|---|---|---|
| 0029782 | 1/1990 | Japan | 117/213 |
| 1017288 | 11/1991 | Japan | 117/213 |
| 4198086 | 7/1992 | Japan | 117/213 |

*Primary Examiner*—Felisa Garrett
*Attorney, Agent, or Firm*—Oblon, Spivak, McClelland, Maier & Neustadt, P.C.

[57] ABSTRACT

A system for growing high-quality, low-carbon-concentration single crystals which have an excellent gas-flow guiding function near the melt, containing 1) an inverted conical, flow-guide cover placed above and coaxially with a double-walled crucible, with its lower end located immediately above the surface of the melt and in the space between the outer surface of the single crystal to be grown and the inner surface of the sidewall of the inner crucible; 2) a short passage comprising a hole passing through the sidewall of the inner crucible at a position higher than the level of the melt; and 3) a flow guide cylinder placed above and coaxially with the double-walled crucible, with its lower end located immediately above the surface of the melt and in the space between the outer surface of the sidewall of the inner crucible and the inner surface of the sidewall of the outer crucible, all arranged in a furnace.

15 Claims, 7 Drawing Sheets

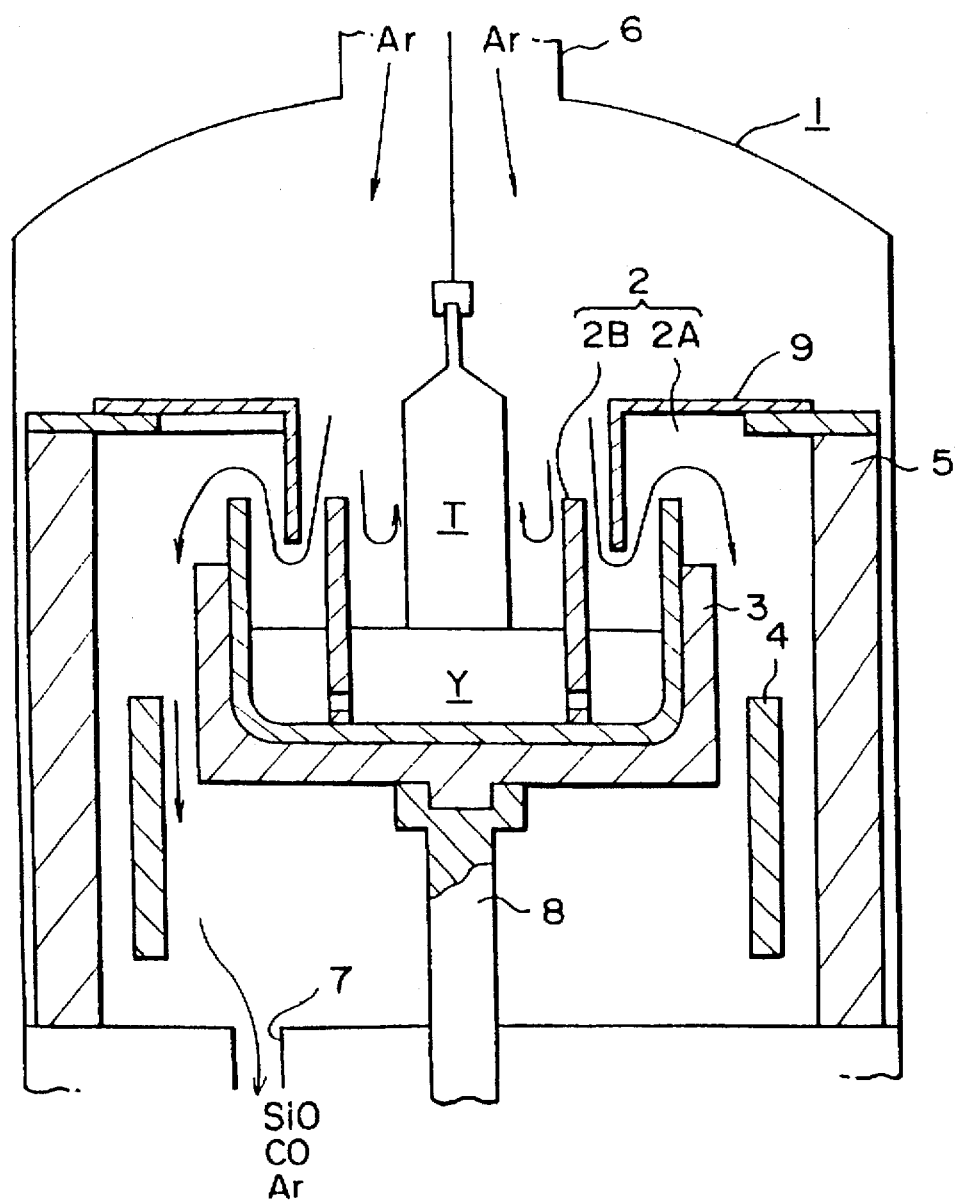

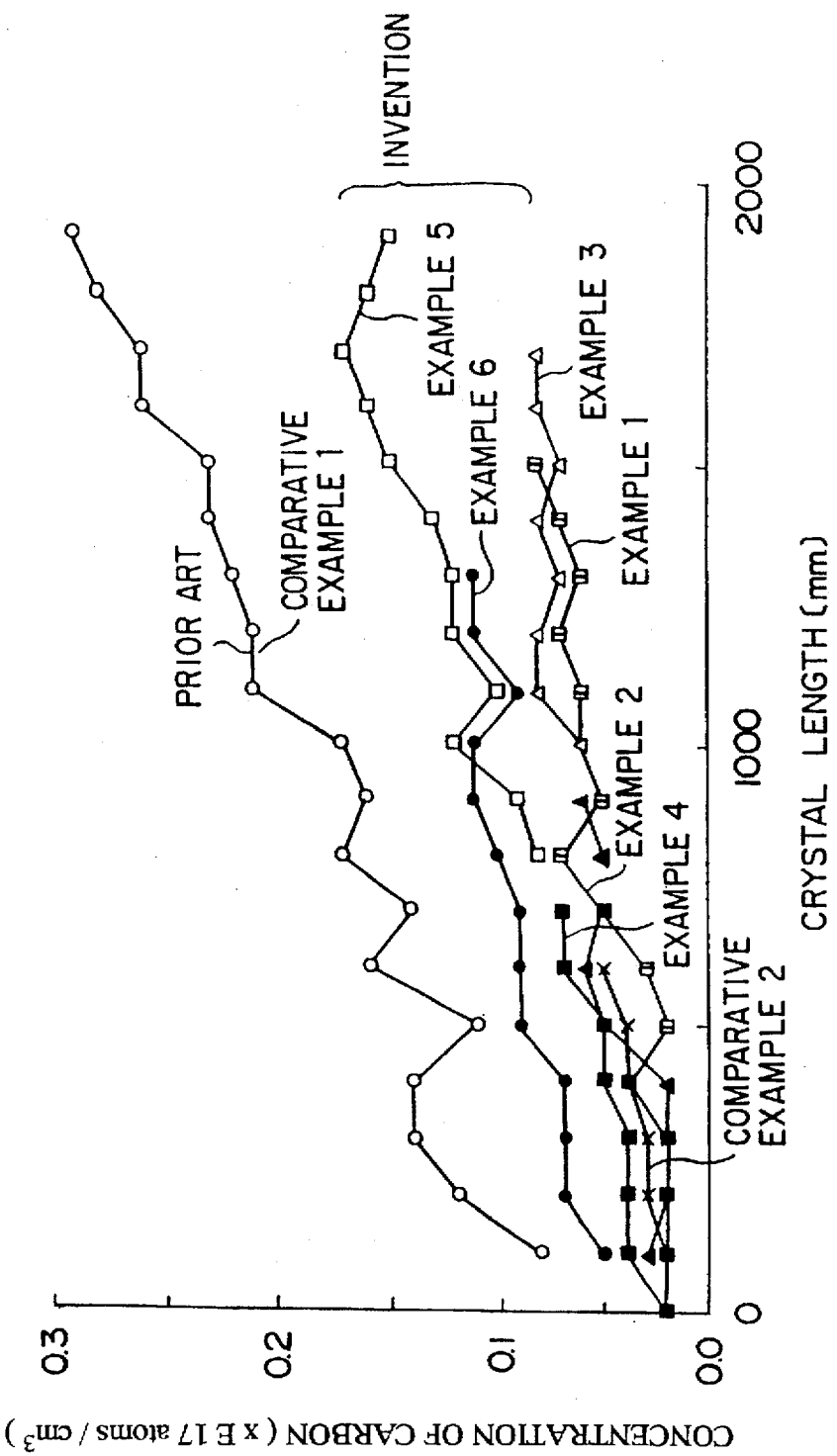

SEMICONDUCTOR SINGLE-CRYSTAL GROWTH SYSTEM

BACKGROUND OF THE INVENTION

1. Field of the Invention

The present invention relates to a semiconductor single-crystal growth system which grows single crystals using a crucible with a double-walled structure, and particularly to a system which includes suppression of the stagnation of CO gas near a melt (hereunder referred to as a "starting melt"), which leads to higher quality single crystals and enhanced manufacturing yields.

2. Description of the Related Art

The Czochralski method (CZ method) is widely used as a method for manufacturing single crystals. This method pulls a growing crystal up from a melt in a crucible.

Attempts to obtain silicon single crystals doped with dopants such as B, P, Sb or the like by the CZ method, have been faced with the problem of non-uniform dopant concentration along the length of the crystal. Since these dopants have segregation coefficients other than 1, the single crystals grown with the CZ method only have the desired quality in certain sections.

As solutions to this problem, Japanese Unexamined Patent Application Disclosure SHO 49-10664 and U.S. Pat. No. 4,352,784, for example, disclose techniques for increasing the yields. These techniques use the so-called double-walled crucible, composed of an outer crucible and an inner crucible placed therein, which are partitioned with an annular diaphragm equipped with a communicating hole drilled therethrough for passage of a starting melt. By using the two melts, the dopant concentration in the inner crucible can be stabilized by supplying some of the melt from the outer crucible. These methods help to establish a more uniform dopant concentration across the growing single crystal. Prior art FIG. 8 is a schematic view of such a structure.

Prior art FIG. 8 shows a single-crystal growth system comprising a furnace 1 which includes a quartz crucible 2 resting on a vertically movable and rotatable lower shaft 8 which extends from a drive unit (not shown) placed outside the furnace 1 and penetrates through the bottom of the furnace 1. The crucible 2 is a double-walled crucible which comprises an outer crucible 2A receiving a cylindrical inner crucible 2B therein, with the outer surface protected by an encircling graphite susceptor 3. The inner crucible 2B is separated from the outer crucible 2A with an annular partition wall equipped with a communicating hole drilled therethrough for passage of a starting melt. In addition, there are provided a cylindrical heater 4 encircling the crucible 2 with a certain spacing, and a heat insulating mold 5 positioned outside the heater 4. Argon gas is supplied to the furnace 1 through a gas inlet 6 and discharged via a gas outlet 7 together with impurities produced from the starting melt Y.

Use of this system can lead to non-uniform carbon concentrations, reducing the yield. Manufacturing silicon single crystals with the above-described system equipped with a double-walled crucible results in a single crystal with a gradual increase in the carbon concentration in the direction from the top to the tail of its growth. Parts of the crystals have carbon concentrations higher than that suitable for use as semiconductor devices, thus decreasing the yields of single crystals.

The carbon contamination originates from a variety of graphite parts (e.g., the heater 4, heat insulating mold 5, susceptor 3, support for the inner crucible 2B, etc.). First, the starting melt Y reacts with the quartz of the crucible 2 to produce silicon monoxide (SiO) gas. This SiO in converted to CO on the surfaces of the graphite parts at high temperatures, according to the following equation:

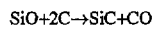

$$SiO + 2C \rightarrow SiC + CO$$

Since carbon contamination is more severe with double-walled crucibles than with the usual single-walled crucibles, double-walled crucibles must have some mechanism which facilitates the dissolution of the evolved CO into the starting melt Y.

The inventors of the present application have conducted a close examination of the behavior of CO gas in double-walled crucible furnaces. As shown in FIG. 8, they have found that the gas stagnates in the space between the inner crucible 2B and the outer crucible 2A, immediately above the starting melt Y, for a relatively long period to cause an increase in the CO concentration of the gas, and to allow continuous contacting of the CO with the melt Y. This results in the ready dissolution of the CO into the melt Y, increasing the carbon concentration of the melt and eventually of the single crystal T.

Based on these findings, the present inventors suggested a structure, as shown in FIG. 9, for example, which comprises a double-walled crucible 2 and a cylindrical gas-flow guide cylinder 9 positioned above, and coaxially with, the crucible 2, with the lower end of the gas-flow guide cylinder 9 placed in the space between the inner crucible 2B and the outer crucible 2A, and with spacings between the lower end, inner crucible, outer crucible and starting melt, respectively. (Japanese Unexamined Patent Application Disclosure HEI 2-116697). With this structure, the flow of the gas in the furnace was indeed improved, and high quality single crystals were obtained, as compared with the previous growth systems based on double-walled crucibles; nevertheless, the flow guide effect was not satisfactory, leaving much to be desired.

SUMMARY OF THE INVENTION

Accordingly, it is an object of the present invention to provide an improved semiconductor single-crystal growth system which has an excellent gas-flow guide function near the melt.

This objective is provided by a semiconductor single-crystal growth system containing a double-walled crucible, and at least two of the following:

(i) an inverted conical flow guide cover, which is placed above and coaxially with the double-walled crucible, the bottom end of the flow-guide cover located above the surface of starting melt Y and in a space within the inner crucible;

(ii) a short passage containing a hole passing through an upper portion of the sidewall of the inner crucible at a position higher than the level of the surface of starting melt Y; and (iii) a flow guide cylinder which is placed above and coaxially with the double-walled crucible, with its lower end located above the surface of starting melt Y and in a space between the outer crucible and the inner crucible.

BRIEF DESCRIPTION OF THE DRAWINGS

FIG. 9 is a section view illustrative of a configuration of another double-walled crucible crystal growing system; and FIG. 10 is a graph showing the change in the carbon concentration of a single crystal along its length which has been manufactured in an experiment according to the present invention, as well as comparative examples.

DETAILED DESCRIPTION OF THE INVENTION

Figure 1:
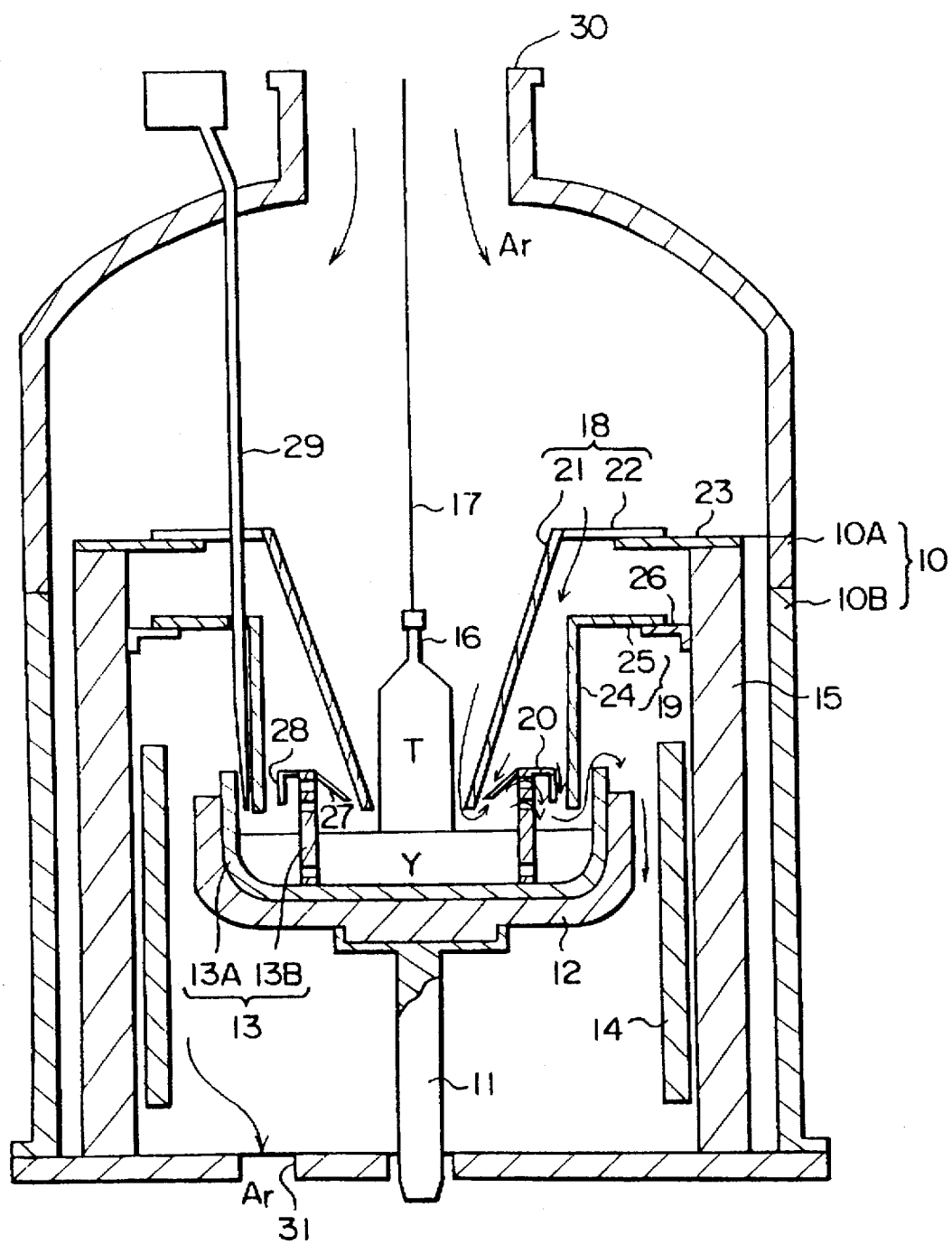
FIG. 1 is a section view illustrative of a first embodiment of the system according to the present invention.

The present invention solves the above-mentioned problems, and is characterized by a combination of at least two of the following:

1) an inverted conical, flow-guide cover which is placed above a double-walled crucible, coaxially therewith, with its lower end located immediately above the surface of the melt and in the space between the outer surface of the single crystal to be grown and the inner surface of the sidewall of the inner crucible;

2) a short passage which comprises a hole passing through the sidewall of the inner crucible at a position higher than the level of the melt; and 3) a flow guide cylinder which is placed above the double-walled crucible, coaxially therewith, with its lower end located immediately above the surface of the melt and in the space between the outer surface of the sidewall of the inner crucible and the inner surface of the sidewall of the outer crucible.

It is desired that both an inverted conical overhang projecting inward from the top of the inner crucible and of a size which does not interfere with the flow guide cover mentioned in 1) above, and a hook-section cylindrical overhang projecting outward from the top of the inner crucible and of a size which does not interfere with the flow guide cylinder mentioned in 3) are provided near the short passage mentioned in 2) above.

Preferably the flow guide cover mentioned in 1) above and the flow guide cylinder mentioned in 3) above, as well as inverted conical overhang and the hook-section cylindrical overhang, are composed of a refractory ceramic material such as SiC, $Si_3N_4$, $Al_2O_3$, BN, $ZrO_2$, $MoSi_2$, tantalum carbide, tungsten carbide, a refractory metal, such as Mo, Ta, W, Zr, Nb, etc., as well as refractory alloys which contain these refractory metals. Preferably, SiC, $Si_3N_4$, Mo, Ta and W are used. Being constructed with graphite or a metal material, the cover and/or the cylinder may have a coating layer of SiC or the like.

In the preferred semiconductor single-crystal growth system mentioned above, an inverted conical flow-guide cover is placed in the space between the outer surface of a growing single crystal and the inner surface of the sidewall of an inner crucible. A short passage through the sidewall of the inner crucible is formed, and a flow guide cylinder is placed in the space between the outer surface of the sidewall of the inner crucible and the inner surface of the sidewall of an outer crucible. This allows argon gas to pass from above into the furnace, and flow near the starting melt as a laminar flow substantially along the surface of the melt in the direction from the center to the outside of the furnace. This prevents stagnation of the gas in the space between the growing single crystal and the inner crucible, as well as in the space between inner crucible and the outer crucible, suppressing mixing of CO into the starting melt.

Although the effect is most noticeable when the system is equipped with the flow guide cover, the short passage and the flow guide cylinder, an adequate effect is produced by a combination of any two of them.

DESCRIPTION OF THE PREFERRED EMBODIMENTS

The present invention will now be explained in further detail with reference to embodiments thereof.

FIGS. 1–4 are schematic views illustrating the configuration of embodiments of the semiconductor single-crystal growth system according to the present invention.

The semiconductor single-crystal growth system according to an embodiment contains, as shown in FIG. 1, a furnace 10 having an upper body 10A and a lower body 10B. The center of the furnace 10 is equipped with a vertically movable and rotatable lower shaft 11 which extends from a drive unit (not shown) located outside the furnace. The lower shaft 11 penetrates through the bottom of the furnace, and a double-walled quartz crucible 13 rests firmly on the upper end of the lower shaft 11 with a graphite susceptor 12 intervening between them. This susceptor 12 is encircled by a heater 14 and a heat insulating mold 15 placed in that order, moving outward.

The double-walled crucible 13 is formed from a bottomed cylindrical outer crucible 13A and a cylindrical inner crucible 13B received coaxially therein. The crucible 13 is constructed with an annular partition wall having a communication hole for passage of the starting melt between the outer crucible 13A and the inner crucible 13B. The lower end of the sidewall of the inner crucible 13B is provided with a communication hole (not shown) which allows passage of a melt Y between the internal space of the outer crucible 13A and the internal space of the inner crucible 13B.

Also, above the furnace 10 there is provided a pull system (not shown) capable of vertically moving and rotating a pull wire 17 which holds a seed crystal 16, to grow a single crystal T from the inside of the inner crucible 13B.

According to the present embodiment, an inverted conical flow-guide cover 18 encircling the growing single crystal T is placed above and coaxially with the crucible 13 formed from the outer crucible 13A and inner crucible 13B. A roughly right cylindrical flow-guide cylinder 19 is placed facing the outer surface of the cover 18. Also, a short passage 20 is formed which comprises a hole passing through the sidewall of the inner crucible 13B at a position higher than the level of the melt Y.

Flow Guide Cover

Figure 2:
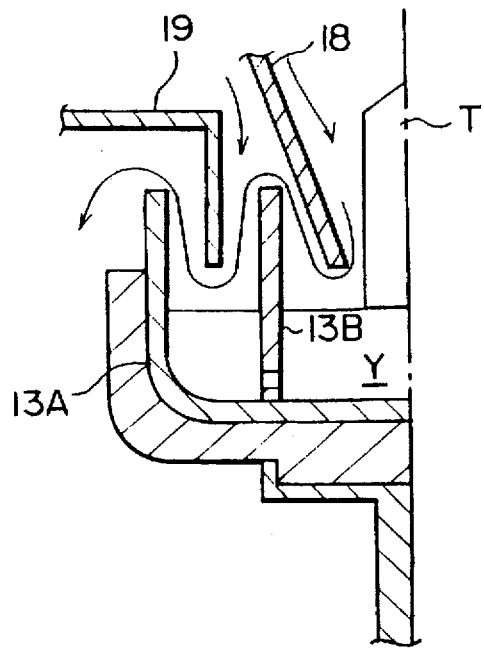
FIG. 2 is a section view illustrative of a second embodiment of the system according to the present invention.
Figure 3:
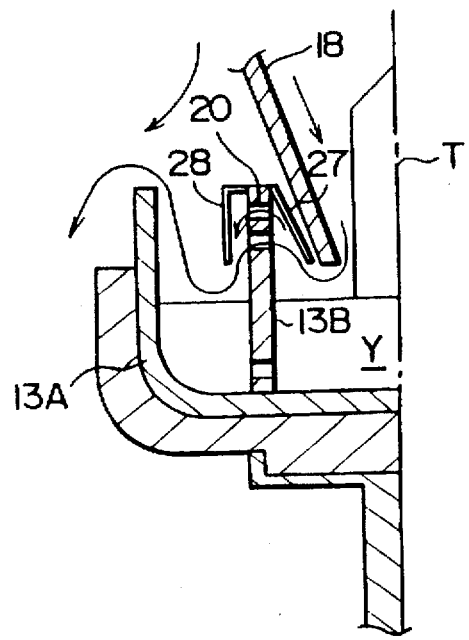
FIG. 3 is a section view illustrative of a third embodiment of the system according to the present invention.

Reference should be made to FIGS. 2 and 3.

The above-mentioned flow guide cover 18, the upper end opening of which has a smaller diameter than the inner diameter of the crucible 13, has an inverted conical section 21 formed with a wall of diameter gradually reduced in the direction from the upper end opening to the lower end opening (tapering diameter). In addition, this flow guide cover 18 has a plurality of, preferably 4, anchor sections 22 which extend horizontally and outward from the upper end thereof in a radial direction, and is held in place by engaging those anchor sections 22 with an annular adapter plate 23 attached onto the heat insulating mold 15.

Figure 5:
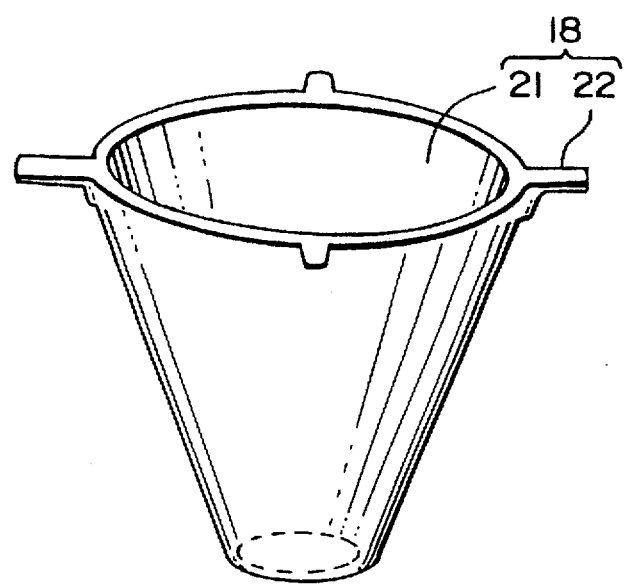
FIG. 5 is a section view illustrative of a fifth embodiment of the system according to the present invention.

Accordingly, in the plane of the cross section of the engaging portion of the flow guide cover 18 which is perpendicular to the axis of the furnace, only some pawl-like anchor sections 22 are present between the adapter plate 23 and the inverted conical section 21. These are spaced from each other without closing all the space surrounding the inverted conical section 21. Therefore, the argon gas coming from above the furnace 10 not only flows inside the flow guide cover 18, but has a branch which flows outside the flow guide cover 18. Here, the anchor sections 22 may be formed integrally with the inverted conical section 21, or separately therefrom, and may be fixed to the inverted conical section 21 with bolts or the like. FIG. 5 is a perspective view of an example of such a flow guide cover 18.

The lower end of the above-described flow guide cover 18 (more specifically the inverted conical section 21) is inserted in the space (first spacing) between the outer surface of the growing single crystal T and the inner surface of the sidewall of the inner crucible 13B, with roughly the same spacings (second through fourth spacings) between the lower end, single crystal T, inner surface of the sidewall of the inner crucible 13B and starting melt Y.

Although it is impossible to generally prescribe these spacings (first through fourth spacings) since they depend on the type and diameter of the single-crystal ingot to be pulled up, the melt temperature and the pull conditions, including the pull speed, the length of the ingot, etc., it is desirable that, for example, the distance (fourth spacing) between the lower end of the flow guide cover 18 and the melt Y be 5 mm or more, and the lower end be positioned lower than the upper end of the inner surface of the sidewall of the inner crucible 13B.

In cases where the distance (fourth spacing) of the lower end of the flow guide cover 18 from the melt Y is shorter than 5 mm, the flow rate of the gas passing through the space increases excessively, causing unwanted vibrations of the melt which in turn may cause dislocations in the growing single crystal T and contacting of the flow guide cover 18 with the melt Y. On the other hand, if the lower end of the flow guide cover 18 is located higher than the upper end of the inner surface of the sidewall of the inner crucible 13B, then no gas-flow guide effect can be produced near the surface of the melt, and thus it becomes impossible to avoid stagnation of the gas in the space between the single crystal T and the inner surface of the sidewall of the inner crucible 13B, and therefore impossible to suppress mixing of CO into the melt Y.

The wall thickness of the lower end of the flow guide cover 18 is preferably from 0.3 to 0.8 times the distance between the single crystal T and the inner surface of the sidewall of the inner crucible 13B. In cases where the ratio is less than 0.3, the gas tends to stagnate near the single crystal T and the inner crucible 13B, and the flow guide effect is lowered. Conversely, in cases where the ratio exceeds 0.8, the lower end may interfere with the single crystal T or the inner crucible 13B.

Although the diameter tapering rate of the inverted conical section 21 of the flow guide cover 18 and the length of the inverted conical section 21 may be varied as necessary, depending on the cooling conditions required for the particular single crystal T, the pull speed, etc., typically the diameter tapering rate is within the range of 0.6 to 1.0, and the length of the inverted conical section 21 ranges from 300 to 500 mm.

Flow Guide Cylinder

Figure 4:
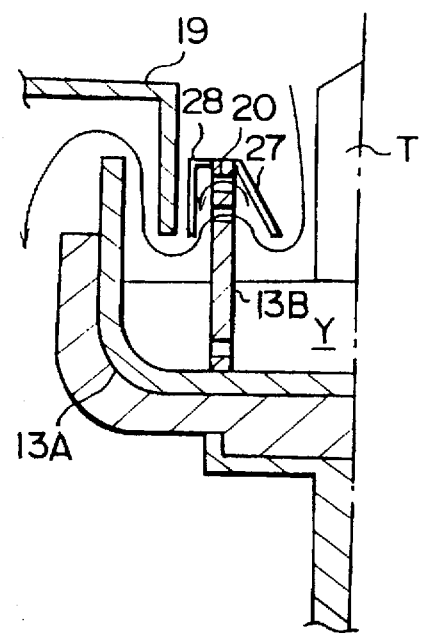
FIG. 4 is a section view illustrative of a fourth embodiment of the system according to the present invention.

Reference should be made to FIG. 4.

The flow guide cylinder 19 has a roughly right-cylindrical section 24 and an annular plate section 25 formed integrally with section 24 and extending outward from the upper end of section 24. Section 25 is held in place by engaging the circumference of the annular plate section 25 with an annular adapter plate 26 attached to the side of the heat insulating mold 15.

The flow guide cylinder 19, though being attached to the side of the heat insulating mold 15 according to the present embodiment, may be attached to the top of the heat insulating mold 15 by engaging the annular plate section 25 with the adapter plate 23 provided on the top of the heat insulating mold 15. In this case, the anchor sections 22 of the flow guide cover 18 are placed on either or both the upper end of the cylindrical section 24 and the annular plate section 25 of the flow guide cylinder 19, while ensuring the downward flow of the gas into the space between the flow guide cover 18 and the flow guide cylinder 19.

The lower end of the flow guide cylinder 19 (more specifically its cylindrical section 24) is placed between the outer surface of the sidewall of the inner crucible 13B and the inner surface of the sidewall of the outer crucible 13A, with roughly the same spacings (fifth through seventh spacings) between the lower end, the outer surface of the sidewall of the inner crucible 13B, the inner surface of the sidewall of the outer crucible 13A and the starting melt Y. In other words, the cylindrical section 24 is placed coaxially with the crucible 13, so that the bottom of cylindrical section 24 is above the starting melt Y.

Although it is impossible to generally prescribe these spacings (fifth through seventh spacings) since they depend on the type and diameter of the single-crystal ingot to be pulled up, the melt temperature and the pull conditions, including the pull speed, the length of the ingot, etc., it is desirable that, for example, the distance (seventh spacing) between the lower end of the flow guide cylinder 19 and the melt Y be 5 mm or more, and the lower end of the flow guide cylinder 19 be positioned lower than the upper end of the outer surface of the sidewall of the inner crucible 13B and lower than the upper end of the inner surface of the sidewall of the outer crucible 13A, for example, approximately 40 mm lower than the lower ends.

In cases where the distance (seventh spacing) of the lower end of the flow guide cylinder 19 from the melt Y is shorter than 5 mm, the flow rate of the gas passing through the space increases excessively, causing unwanted vibrations of the melt which in turn may cause dislocations in the growing single crystal T and contacting of the flow guide cylinder 19 with the melt Y. On the other hand, if the lower end of the flow guide cylinder 19 is located higher than the upper end of the outer surface of the sidewall of the inner crucible 13B, and higher than the upper end of the inner surface of the sidewall of the outer crucible 13A, then no gas-flow guide effect can be produced near the surface of the melt Y, and therefore it becomes impossible to avoid stagnation of the gas in the space between the outer surface of the sidewall of the inner crucible 13B and the inner surface of the sidewall of the outer crucible 13A, and thus impossible to suppress mixing of CO into the melt Y.

In addition, the wall thickness of the lower end of the flow guide cylinder 19 preferably is from 0.3 to 0.8 times the distance between the outer surface of the sidewall of the inner crucible 13B and the inner surface of the sidewall of the outer crucible 13A. In cases where the ratio is less than 0.3, the gas tends to stagnate near the inner crucible 13B and the outer crucible 13A, and the flow guide effect is lowered. Conversely, in cases where the ratio exceeds 0.8, the lower end may interfere with the inner crucible 13B and/or the outer crucible 13A.

Short Passage

The above-mentioned short passage 20 may be one or more holes passing through the sidewall of the above-described inner crucible 13B, arranged at positions higher than the level of the melt Y along the entire circumference of the sidewall. The holes should have roughly equal spacings, regardless of the size, shape, position, etc. of the respective openings. For example, all the openings may be arranged horizontally in a row, different from the two or more row arrangement shown in the drawings. They may be shaped as a plurality of discontinuous circular holes or as slits of somewhat longer sizes along the circumference of the sidewall, for example.

In addition, the bottom of the short passage 20 is desired to be at least 10 mm higher than the level of the melt Y. Otherwise the melt Y may pass through the short passage 20.

Provided above and near the short passage 20 in the sidewall of the inner crucible 13B are an inverted conical overhang 27 projecting inward from the top of the inner crucible 13B and of a size which does not interfere with the flow guide cover 18, and a hook-section cylindrical overhang 28 projecting outward from the top of the inner crucible 13B and of a size which does not interfere with the flow guide cylinder 19, so that the flow of the gas near the surface of the melt Y in the direction from the center to the outside of the furnace can be controlled to have a minimum distance from the surface of the melt Y before and after passing through the short passage 20.

The distance of the lower end of each of the overhangs 27 and 28 from the surface of the melt is preferably on the order of 10–30 mm. In cases where the distances from the surface of the melt Y are excessively short, the controlled flow of the gas causes disturbance of the melt Y which in turn may cause dislocations in the single crystal. If the distances are unnecessarily long the flow guide effect expected by their provision is not produced.

Figure 6:
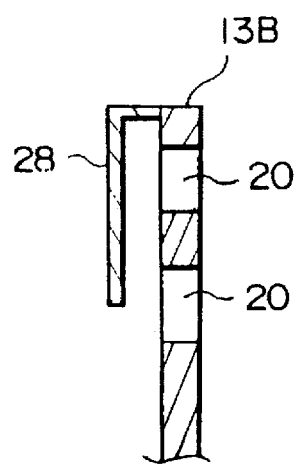
FIG. 6 is a section view illustrative of a sixth embodiment of the system according to the present invention.
Figure 7:
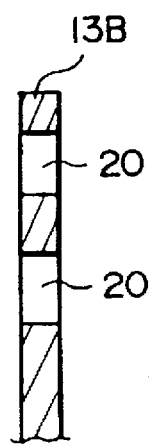
FIG. 7 is a section view illustrative of a seventh embodiment of the system according to the present invention.
Figure 8:
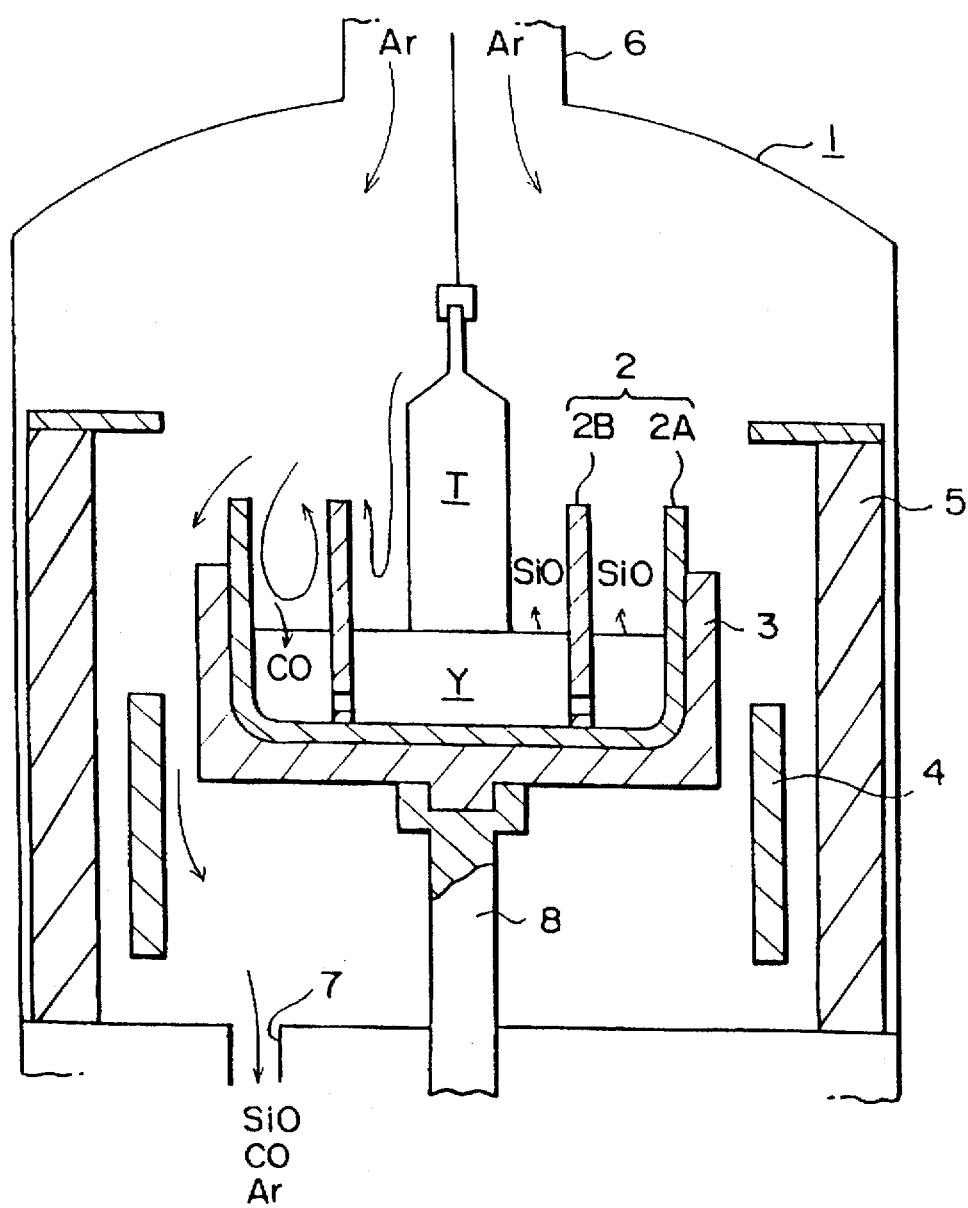
FIG. 8 is a section view illustrative of a configuration of an embodiment of a double-walled crucible crystal growing system.

Although the embodiment shown in FIG. 1 has the overhangs 27 and 28 near the short passage 20, the inner crucible 13B may be constructed without either or both of them, as shown in FIG. 6 and FIG. 7.

Although the material which composes the flow guide cover 18 and the flow guide cylinder 19 may be graphite, preferably it is a single or composite refractory material, including a refractory ceramic such as SiC, $Si_3N_4$, $Al_2O_3$, BN, $ZrO_2$, $MoSi_2$, tantalum carbide, tungsten carbide, a metal such as Mo, Ta, W, Zr, Nb, etc., as well as refractory alloys which contain these metals. Being constructed with graphite or a metal material, the cover 18 and/or the cylinder 19 may have a coating layer of SiC or the like if necessary in order to prevent contamination of the single crystal T with the carbon or metal.

The present embodiment also has a feed pipe 29 for supplying a starting material to the space between the inner crucible 13B and the outer crucible 13A. The feed pipe 29 extends from the outside into the inside of the furnace 10, penetrates the annular plate section 25 of the gas-flow guide cylinder 19, and is fixed along the outer surface of the cylindrical section 24. The feed pipe 29 may be fixed in a slit formed in the cylindrical section 24 or placed along the inner surface of the cylindrical section 24. The numeral 30 indicates a gas inlet, and 31 indicates a gas outlet.

In order to use a semiconductor single-crystal growth system according to the present embodiment, first a silicon material is charged into the double-walled crucible 13, and the material is made molten by powering the heater 14 while supplying argon gas through the gas inlet 30. Then, the double-walled crucible 13 is lifted to optimize the distances from the gas-flow guide cover 18 and the gas-flow guide cylinder 19, and a seed crystal 16 is immersed in the melt Y to grow a single crystal T while replenishing the crucible 13 with the material through the feed pipe 29, making up for the loss from the melt. In the course of growth of the single crystal, the melt Y reacts with the crucible 13 to produce SiO, part of which then reacts with the graphite parts in the furnace 10 to produce CO.

Meanwhile, the argon gas supplied through the gas inlet 30 is branched into downward flows inside the inverted conical section 21 of the gas-flow guide cover 18 along the single crystal T and flows downward outside the inverted conical section 21, due to the presence of the gas-flow guide cover 18.

The downward flows outside the inverted conical section 21 are all guided to the inside of the cylindrical section 24 by the annular plate section 25 of the gas-flow guide cylinder 19, and spread down in the vicinity of the surface of the melt Y via the space between the inverted conical section 21 and the cylindrical section 24. The downward gas flows inside the inverted conical section 21 along the single crystal T merge, immediately above the surface of the melt Y, with the downward gas flows which have passed through the space between the inverted conical section 21 and the cylindrical section 24. The gas then flows into the inside of the inner crucible 13B, and the merged flows spread toward the sidewall of the inner crucible 13B, roughly in parallel with the surface of the melt Y, and pass through the short passage 20 into the space between the inner crucible 13B and the outer crucible 13A.

In the space the gas flows merge with the other gas flows which have spread down to the space after having passed through the space between the inverted conical section 21 and the cylindrical section 24, and the merged flows spread outward to the gas outlet 31. In this way, all the gas flowing in the furnace 10 swiftly spread from the center to the outside, reaching the gas outlet 31, without stagnating at any site near the surface of the melt Y.

Since the SiO and CO discussed above are ejected without stagnating in the space between the growing single crystal T and the inner crucible 13B and in the space between the inner crucible 13B and the outer crucible 13A by way of the above-described procedures, the total amount of CO mixed in the melt is greatly reduced, and high-quality single crystals T, with lowered carbon concentrations, are manufactured.

The lower ends of the gas-flow guide cover 18, the flow guide cylinder 19 and the overhangs 27 and 28 according to the above-described embodiment may be square-cornered or chamfered round, or may have increased wall thicknesses and be wholly rounded off to have curved surfaces. With this design, vortices are unlikely to form near the lower ends, and improved flow-guide effects are produced. Also, according to the above-described embodiment, the material in the melt is replenished continuously through the feed pipe 29 while pulling up the single crystal T. Alternatively, the process may be carried out in batches, without replenishment of the material. However, in this case, it may become necessary to maintain certain positional relationships between the melt Y, the gas-flow guide cover 18 and the flow guide cylinder 19 by lifting the crucible 13 to follow the decrease in the amount of the melt Y as the crystal growing process progresses.

FIG. 2 shows a second embodiment of the present invention which is constructed substantially in the same manner as the embodiment of FIG. 1, except that no short passage 20 (nor overhangs 27 and 28, obviously) is formed. FIG. 3 shows a third embodiment of the present invention which is constructed substantially in the same manner as the embodiment of FIG. 1, except that no flow guide cylinder 19 is provided. FIG. 4 shows a fourth embodiment of the present invention which is constructed substantially in the same manner as the embodiment of FIG. 1, except that no flow guide cover 18 is provided.

All of these additional embodiments produce substantially the same flow guide effects as the above-described embodiment, and the gas flowing in the furnace 10 swiftly spreads from the center to the outside of the furnace 10 to reach the gas outlet 31, without stagnating at any site near the surface of the melt Y. Accordingly, the SiO and CO discussed above are ejected without stagnating in the space between the growing single crystal T and the inner crucible 13B, and in the space between the inner crucible 13B and the outer crucible 13A.

The effects of the present invention will now be proved based on data from actual growth of single crystals, which are given for illustration of the invention and are not intended to be limiting thereof.

Unless otherwise noted, in the following examples the crucibles are made of quartz, the gas flow guide is made of SiC coated graphite, the gas flow cover is made from Mo, and the overhangs are made of Mo. Other parts are made from graphite.

EXAMPLE 1

With a system of the configuration shown in FIG. 1, a single crystal was grown to an entire length of 1500 mm under the following growing conditions:

Inner diameter of the outer crucible: 536 mm
Inner diameter of the inner crucible: 392 mm
Initial charge of the material: 40 kg
Initial depth of the melt: 112 mm
Outer diameter of the single crystal: 105 mm
Heights of the upper ends of the outer surfaces of the sidewalls of the outer and inner crucibles from the melt: Both 100 mm
Outer diameter of the lower end of the gas-flow guide cover: 280 mm
Wall thickness of the lower end of the gas-flow guide cover: 50 mm
Height of the lower end of the gas-flow guide cover from the melt: 25 mm
Distance of the lower end of the gas-flow guide cover from the single crystal: 37.5 mm
Distance of the lower end of the gas-flow guide cover from the outer surface of the sidewall of the inner crucible: 56 mm
Height of the short passage from the melt: 15 mm
Outer diameter of the lower end of the gas-flow guide cylinder: 480 mm
Wall thickness of the lower end of the gas-flow guide cylinder: 22 mm
Height of the lower end of the gas-flow guide cylinder from the melt: 30 mm
Distance of the lower end of the gas-flow guide cylinder from the outer surface of the sidewall of the inner crucible: 28 mm
Distance of the lower end of the gas-flow guide cylinder from the outer surface of the sidewall of the outer crucible: 56 mm
Feed of argon gas: 40 l/min. (under normal pressure)
Replenishment with the material: Yes

EXAMPLE 2

With a system of the configuration shown in FIG. 1, a single crystal was grown to an entire length of 1500 mm under the following growing conditions:

Inner diameter of the outer crucible: 536 mm
Inner diameter of the inner crucible: 340 mm
Initial charge of the material: 40 kg
Initial depth of the melt: 112 mm
Outer diameter of the single crystal: 105 mm
Heights of the upper ends of the outer surfaces of the sidewalls of the outer and inner crucibles from the melt: Both 100 mm
Outer diameter of the lower end of the gas-flow guide cover: 265 mm
Wall thickness of the lower end of the gas-flow guide cover: 40 mm
Height of the lower end of the gas-flow guide cover from the melt: 25 mm
Distance of the lower end of the gas-flow guide cover from the single crystal: 40 mm
Distance of the lower end of the gas-flow guide cover from the outer surface of the sidewall of the inner crucible: 37.5 mm
Height of the short passage from the melt: 15 mm
Outer diameter of the lower end of the gas-flow guide cylinder: 480 mm
Wall thickness of the lower end of the gas-flow guide cylinder: 28 mm
Height of the lower end of the gas-flow guide cylinder from the melt: 30 mm
Distance of the lower end of the gas-flow guide cylinder from the outer surface of the sidewall of the inner crucible: 29.5 mm
Distance of the lower end of the gas-flow guide cylinder from the outer surface of the sidewall of the outer crucible: 56 mm
Feed of argon gas: 40 l/min. (under normal pressure)
Replenishment with the material: Yes

EXAMPLE 3

With a system of the configuration shown in FIG. 1, a single crystal was grown to an entire length of 1700 mm under the following growing conditions:

Inner diameter of the outer crucible: 536 mm
Inner diameter of the inner crucible: 340 mm
Initial charge of the material: 40 kg
Initial depth of the melt: 112 mm
Outer diameter of the single crystal: 105 mm Heights of the upper ends of the outer surfaces of the sidewalls of the outer and inner crucibles from the melt: Both 100 mm Outer diameter of the lower end of the gas-flow guide cover: 265 mm Wall thickness of the lower end of the gas-flow guide cover: 40 mm Height of the lower end of the gas-flow guide cover from the melt: 25 mm Distance of the lower end of the gas-flow guide cover from the single crystal: 40 mm Distance of the lower end of the gas-flow guide cover from the outer surface of the sidewall of the inner crucible: 37.5 mm Height of the short passage from the melt: 15 mm Outer diameter of the lower end of the gas-flow guide cylinder: 480 mm Wall thickness of the lower end of the gas-flow guide cylinder: 28 mm Height of the lower end of the gas-flow guide cylinder from the melt: 30 mm Distance of the lower end of the gas-flow guide cylinder from the outer surface of the sidewall of the inner crucible: 29.5 mm Distance of the lower end of the gas-flow guide cylinder from the outer surface of the sidewall of the outer crucible: 56 mm Feed of argon gas: 40 l/min. (under normal pressure)

Replenishment with the material: Yes

EXAMPLE 4

With a system of the configuration shown in FIG. 1 wherein the configuration near the short passage, however, was replaced by the one shown in FIG. 3, a single crystals was grown to an entire length of 700 mm under the following growing conditions:

Inner diameter of the outer crucible: 536 mm

Inner diameter of the inner crucible: 392 mm

Initial charge of the material: 40 kg

Initial depth of the melt: 112 mm

Outer diameter of the single crystal: 160 mm

Heights of the upper ends of the outer surfaces of the sidewalls of the outer and inner crucibles from the melt: Both 100 mm Outer diameter of the lower end of the gas-flow guide cover: 310 mm Wall thickness of the lower end of the gas-flow guide cover: 35 mm Height of the lower end of the gas-flow guide cover from the melt: 25 mm Distance of the lower end of the gas-flow guide cover from the single crystal: 40 mm Distance of the lower end of the gas-flow guide cover from the outer surface of the sidewall of the inner crucible: 41 mm Height of the short passage from the melt: 15 mm Outer diameter of the lower end of the gas-flow guide cylinder: 480 mm Wall thickness of the lower end of the gas-flow guide cylinder: 22 mm Height of the lower end of the gas-flow guide cylinder from the melt: 30 mm Distance of the lower end of the gas-flow guide cylinder from the outer surface of the sidewall of the inner crucible: 28 mm Distance of the lower end of the gas-flow guide cylinder from the outer surface of the sidewall of the outer crucible: 56 mm Feed of argon gas: 40 l/min. (under normal pressure)

Replenishment with the material: Yes

EXAMPLE 5

A single crystal was grown to an entire length of 1900 mm in the same manner as in Example 4, with the exception of a change in the pulling speed.

EXAMPLE 6

With a system of the configuration shown in FIG. 2, a single crystal was grown to an entire length of 1500 mm under the following growing conditions:

Inner diameter of the outer crucible: 536 mm

Inner diameter of the inner crucible: 392 mm

Initial charge of the material: 40 kg

Initial depth of the melt: 112 mm

Outer diameter of the single crystal: 160 mm

Heights of the upper ends of the outer surfaces of the sidewalls of the outer and inner crucibles from the melt: Both 100 mm Outer diameter of the lower end of the gas-flow guide cover: 310 mm Wall thickness of the lower end of the gas-flow guide cover: 35 mm Height of the lower end of the gas-flow guide cover from the melt: 25 mm Distance of the lower end of the gas-flow guide cover from the single crystal: 40 mm Distance of the lower end of the gas-flow guide cover from the outer surface of the sidewall of the inner crucible: 41 mm Outer diameter of the lower end of the gas-flow guide cylinder: 480 mm Wall thickness of the lower end of the gas-flow guide cylinder: 22 mm Height of the lower end of the gas-flow guide cylinder from the melt: 30 mm Distance of the lower end of the gas-flow guide cylinder from the outer surface of the sidewall of the inner crucible: 28 mm Distance of the lower end of the gas-flow guide cylinder from the outer surface of the sidewall of the outer crucible: 56 mm Feed of argon gas: 40 l/min. (under normal pressure)

Replenishment with the material: Yes

COMPARATIVE EXAMPLE 1

With a system of the configuration shown in FIG. 2 wherein the flow guide cylinder, however, was removed, a single crystal was grown to an entire length of 1500 mm under the following growing conditions:

Inner diameter of the outer crucible: 536 mm

Inner diameter of the inner crucible: 392 mm

Initial charge of the material: 40 kg

Initial depth of the melt: 112 mm

Outer diameter of the single crystal: 160 mm

Heights of the upper ends of the outer surfaces of the sidewalls of the outer and inner crucibles from the melt: Both 100 mm Outer diameter of the lower end of the gas-flow guide cover: 310 mm Wall thickness of the lower end of the gas-flow guide cover: 35 mm Height of the lower end of the gas-flow guide cover from the melt: 25 mm Distance of the lower end of the gas-flow guide cover from the single crystal: 40 mm Distance of the lower end of the gas-flow guide cover from the outer surface of the sidewall of the inner crucible: 41 mm Feed of argon gas: 40 l/min. (under normal pressure)

Replenishment with the material: Yes

COMPARATIVE EXAMPLE 2

With a system of the configuration in Comparative Example 1 wherein the double-walled crucible, however, was replaced by a conventional single-walled crucible, a single crystal was grown to an entire length of 600 mm under the following growing conditions:

Inner diameter of the crucible: 536 mm

Initial charge of the material: 40 kg

Initial depth of the melt: 110 mm

Outer diameter of the single crystal: 160 mm

Outer diameter of the lower end of the gas-flow guide cover: 310 mm

Wall thickness of the lower end of the gas-flow guide cover: 15 mm

Height of the lower end of the gas-flow guide cover from the melt: 25 mm

Distance of the lower end of the gas-flow guide cover from the single crystal: 60 mm Distance of the lower end of the gas-flow guide cover from the outer surface of the sidewall of the crucible: 113 mm Feed of argon gas: 40 l/min. (under normal pressure)

Replenishment with the material: No (batch-wise)

The carbon concentrations of the eight single crystals manufactured in this way were measured at multiple points along their lengths with an infrared measuring instrument (carbon detection limit: $0.005 \times 10^{17}$ atoms/cm$^3$). The results are shown in FIG. 10. As is apparent from the results shown in FIG. 10, with the configuration of the comparative example equipped with a flow guide cover alone, the carbon concentration gradually increased as the single crystal grew, whereas with the configuration according to the present invention, the carbon concentration was maintained at a very low level along almost the entire length of the single crystal, in fact at almost the same level as with a single-walled crucible.

As described above, with a semiconductor single-crystal growth system according to the present invention, the argon gas supplied to the inside of the furnace from above the furnace swiftly flows as a laminar flow substantially along the surface of the melt in the direction from the center to the outside of the furnace, thereby preventing stagnation of the gas in the space between the growing single crystal and the inner crucible and in the space between the inner crucible and the outer crucible. The present invention suppresses mixing of CO into the starting melt, thus manufacturing high-quality single crystals having lowered carbon concentrations.

Japanese patent application HEI 06-196617 is hereby incorporated by reference.

Obviously, numerous modifications and variations of the present invention are possible in light of the above teachings. It is therefore to be understood that within the scope of the appended claims, the invention may be practiced otherwise as is specifically described herein.

What is claimed as new and desired to be secured by Letters Patent of the United States is:

1. A semiconductor single-crystal growth system comprising a double-walled crucible, comprising an inner crucible inside of an outer crucible, with a first hole passing through a lower portion of a side wall of said inner crucible; and at least two members selected from a group consisting of:
(i) an inverted conical flow guide cover, which is placed above and coaxially with said double-walled crucible, the bottom end of said flow-guide cover located above a surface of a starting melt and in a space within said inner crucible;
(ii) a short passage comprising a second hole passing through an upper portion of said side wall of said inner crucible at a position above a level of said surface of the starting melt; and
(iii) a flow guide cylinder which is placed above and coaxially with said double-walled crucible, with its lower end located above said surface of the starting melt and in a space within said outer crucible, wherein said at least two members are
(a) components (i), (ii) and (iii),
(b) components (i) and (ii), or
(c) components (ii) and (iii).

2. The semiconductor single-crystal growth system of claim 1, comprising: (i) said flow guide cover, (ii) said short passage and (iii) said flow guide cylinder.

3. The semiconductor single-crystal growth system of claim 1, comprising (i) said flow guide cover and (ii) said short passage.

4. The semiconductor single-crystal growth system of claim 1, comprising (ii) said short passage and (iii) said flow guide cylinder.

5. The semiconductor single-crystal growth system of claim 1, comprising (i) said flow guide cover, wherein said flow guide cover comprises a material selected from the group consisting of SiC, $Si_3N_4$, $Al_2O_3$, BN, $ZrO_2$, $MoSi_2$, tantalum carbide, tungsten carbide, Mo, Ta, W, Zr and Nb.

6. The semiconductor single-crystal growth system of claim 1, comprising (iii) said flow guide cylinder, wherein said flow guide cylinder comprises a material selected from the group consisting of SiC, $Si_3N_4$, $Al_2O_3$, BN, $ZrO_2$, $MoSi_2$, tantalum carbide, tungsten carbide, Mo, Ta, W, Zr and Nb.

7. The semiconductor single-crystal growth system of claim 1, wherein the bottom end of said flow-guide cover is located 5 mm or more above said surface of a starting melt.

8. The semiconductor single-crystal growth system of claim 1, wherein said inverted conical flow guide cover has an inverted conical section having a length from 300–500 mm.

9. The semiconductor single-crystal growth system of claim 8, wherein said inverted conical section has a diameter tapering rate of 0.6–1.0.

10. The semiconductor single-crystal growth system of claim 1, wherein said lower end or said flow guide cylinder is located 5 mm or more above said surface of the starting melt.

11. The semiconductor single-crystal growth system of claim 1, wherein said short passage has a bottom portion which is located at least 10 mm above said level of said surface of the starting melt.

12. The semiconductor single-crystal growth system of claim 1, wherein said flow guide cover comprises SiC coated graphite.

13. The semiconductor single-crystal growth system of claim 12, wherein said flow guide cylinder comprises Mo.

14. A semiconductor single-crystal growth system comprising
- a double-walled crucible, comprising an inner crucible inside of an outer crucible, with a first hole passing through a lower portion of a side wall of said inner crucible; and
- at least two members selected from a group consisting of:
  (i) an inverted conical flow guide cover, which is placed above and coaxially with said double-walled crucible, the bottom end of said flow-guide cover located above a surface of a starting melt and in a space within said inner crucible;
  (ii) a short passage comprising a second hole passing through an upper portion of said side wall of said inner crucible at a position above a level of said surface of the starting melt; and
  (iii) a flow guide cylinder which is placed above and coaxially with said double-walled crucible, with its lower end located above said surface of the starting melt and in a space within said outer crucible,
- further comprising an overhang, near and above said second hole, selected from a group consisting of
  (iv) an inverted conical overhang projecting toward the center of said inner crucible, from the top of said inner crucible, and
  (v) a hook-section cylindrical overhang projecting away from the center of said inner crucible, from the top of the inner crucible.

15. The semiconductor single-crystal growth system of claim 14, comprising (iv) said inverted conical overhang and (v) said hook-section cylindrical overhang.

* * * * *